US009202853B2

(12) United States Patent
Kim et al.

(10) Patent No.: US 9,202,853 B2
(45) Date of Patent: Dec. 1, 2015

(54) ORGANIC ELECTROLUMINESCENT DISPLAY DEVICE HAVING PLURALITY OF DRIVING TRANSISTORS AND PLURALITY OF ANODES OR CATHODES PER PIXEL (71) Applicant: SAMSUNG DISPLAY CO., LTD., Yongin-si, Gyeonggi-do (KR)

(72) Inventors: Eun-Ah Kim, Suwon-si (KR); Jeong-No Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 120 days.

(21) Appl. No.: 13/861,990

(22) Filed: Apr. 12, 2013

(65) Prior Publication Data
US 2013/0221339 A1    Aug. 29, 2013

Related U.S. Application Data (62) Division of application No. 11/217,596, filed on Aug. 31, 2005, now Pat. No. 8,441,420.

(30) Foreign Application Priority Data

Sep. 21, 2004   (KR) .................. 10-2004-0075655

(51) Int. Cl.
*G09G 3/32* (2006.01)
*H01L 27/32* (2006.01)

(52) U.S. Cl.
CPC .......... *H01L 27/3276* (2013.01); *G09G 3/3233* (2013.01); *G09G 2300/0443* (2013.01); *G09G 2300/0842* (2013.01)

(58) Field of Classification Search
CPC ....................................... G09G 3/32

USPC ............................................. 345/82
See application file for complete search history.

(56) References Cited

U.S. PATENT DOCUMENTS 6,501,448 B1   12/2002   Komiya et al.
6,518,941 B1    2/2003   Kimura
(Continued)

FOREIGN PATENT DOCUMENTS

KR    2002-0025842       4/2002
KR    10-2005-0050001    5/2005
WO    WO 2005/101513 A1  10/2005

OTHER PUBLICATIONS

Korean Patent Abstracts, Publication No. 1020020025842 A, dated Apr. 4, 2002, in the name of Katsuya Anzai et al.

(Continued)

*Primary Examiner* — Long D Pham
(74) *Attorney, Agent, or Firm* — Christie, Parker & Hale, LLP (57) ABSTRACT An organic electroluminescent (EL) display device having a plurality of pixel circuits formed at crossing points of a plurality of scan lines and a plurality of data lines is provided. Each pixel circuit includes at least two driving transistors connected to a first power voltage line, the at least two driving transistors receiving a data signal through at least one of the data lines and outputting a driving current corresponding to the data signal; and an organic light emitting diode having at least two first electrodes respectively connected to the at least two driving transistors and emitting a light corresponding to the driving current. The organic light emitting diode has the at least two first electrodes and a common second electrode per pixel in order to prevent the whole pixel from not operating due to a short circuit occurring between one of the first electrodes and the second electrode.

9 Claims, 8 Drawing Sheets

(56) References Cited

U.S. PATENT DOCUMENTS

| | | |
|---|---|---|
| 6,690,697 B1 | 2/2004 | Kahen |
| 6,791,129 B2 | 9/2004 | Inukai |
| 2001/0019133 A1* | 9/2001 | Konuma et al. .............. 257/79 |
| 2002/0070381 A1 | 6/2002 | Yamada et al. |
| 2002/0084746 A1 | 7/2002 | Anzai |
| 2004/0065902 A1 | 4/2004 | Yamazaki et al. |
| 2004/0173819 A1 | 9/2004 | Matsumoto |
| 2004/0239658 A1 | 12/2004 | Koyama et al. |
| 2004/0245531 A1* | 12/2004 | Fuii et al. ................ 257/88 |
| 2004/0246209 A1 | 12/2004 | Sung |
| 2004/0252085 A1 | 12/2004 | Miyagawa |
| 2004/0263499 A1 | 12/2004 | Tanada et al. |
| 2005/0012694 A1 | 1/2005 | Park et al. |
| 2005/0161665 A1 | 7/2005 | Winters et al. |
| 2005/0186330 A1 | 8/2005 | Kim et al. |
| 2005/0285508 A1 | 12/2005 | Murayama et al. |
| 2006/0028495 A1 | 2/2006 | Phan |
| 2006/0170712 A1 | 8/2006 | Miller et al. |
| 2007/0108443 A1 | 5/2007 | Kim |
| 2007/0216610 A1 | 9/2007 | Smith |
| 2007/0222800 A1 | 9/2007 | Fish et al. |

OTHER PUBLICATIONS

Korean Patent Abstracts, Publication No. 1020050050001 A, dated May 27, 2005, in the name of Eun Ah Kim et al.

Sedra, A, et al., *13.3 CMOS Logic-Gate Circuits*, Microelectronic Circuits, Fourth Edition, Oxford University Press: New York, (1998), 3 pages.

U.S. Office action dated Feb. 3, 2010, for related U.S. Appl. No. 11/599,670.

U.S. Office action dated Jan. 9, 2012, for cross reference U.S. Appl. No. 11/599,670, 13 pages.

U.S. Office action dated Jul. 20, 2010, for cross-reference U.S. Appl. No. 11/599,670.

\* cited by examiner

(PRIOR ART)

ORGANIC ELECTROLUMINESCENT DISPLAY DEVICE HAVING PLURALITY OF DRIVING TRANSISTORS AND PLURALITY OF ANODES OR CATHODES PER PIXEL

CROSS-REFERENCE TO RELATED APPLICATION

This application is a divisional of U.S. patent application Ser. No. 11/217,596, filed on Aug. 31, 2005, which, in turn, claims priority to and the benefit of Korean Patent Application No. 10-2004-0075655, filed Sep. 21, 2004, the disclosure of each of the above-referenced applications is incorporated herein by reference.

BACKGROUND OF THE INVENTION

1. Field

The present invention relates to an organic electroluminescent (EL) display device, and more particularly, to an organic EL display device which includes at least two driving transistors and an organic light emitting diode having at least two first electrodes and a common second electrode per pixel in order to operate the pixel due to a short circuit occurring between one of the first electrode and the second electrode

2. Description of the Related Art

An organic light emitting diode is an emissive device which emits fluorescent light by recombining electrons supplied from a cathode and holes supplied from an anode. An EL display device, which employs the organic light emitting diode, does not need a separate backlight, in contrast with a liquid crystal display (LCD) device, and has a wide viewing angle, fast response speed, low DC driving voltage, and light weight as compared to a passive light emitting diode. Thus, the EL display device is suitable for use as a wall-mountable display device or a portable display device.

Methods of driving an organic EL display panel of an EL display device include a passive matrix driving method and an active matrix method using a thin film transistor (TFT). In the passive matrix driving method, an anode and a cathode are formed to be perpendicular to each other, and the display panel is driven by selecting a line. In the active matrix driving method, the TFT is connected to an anode, e.g., indium tin oxide (ITO), and the display panel is driven according to a voltage maintained by a capacitor connected to a gate of the TFT.

Figure 1:
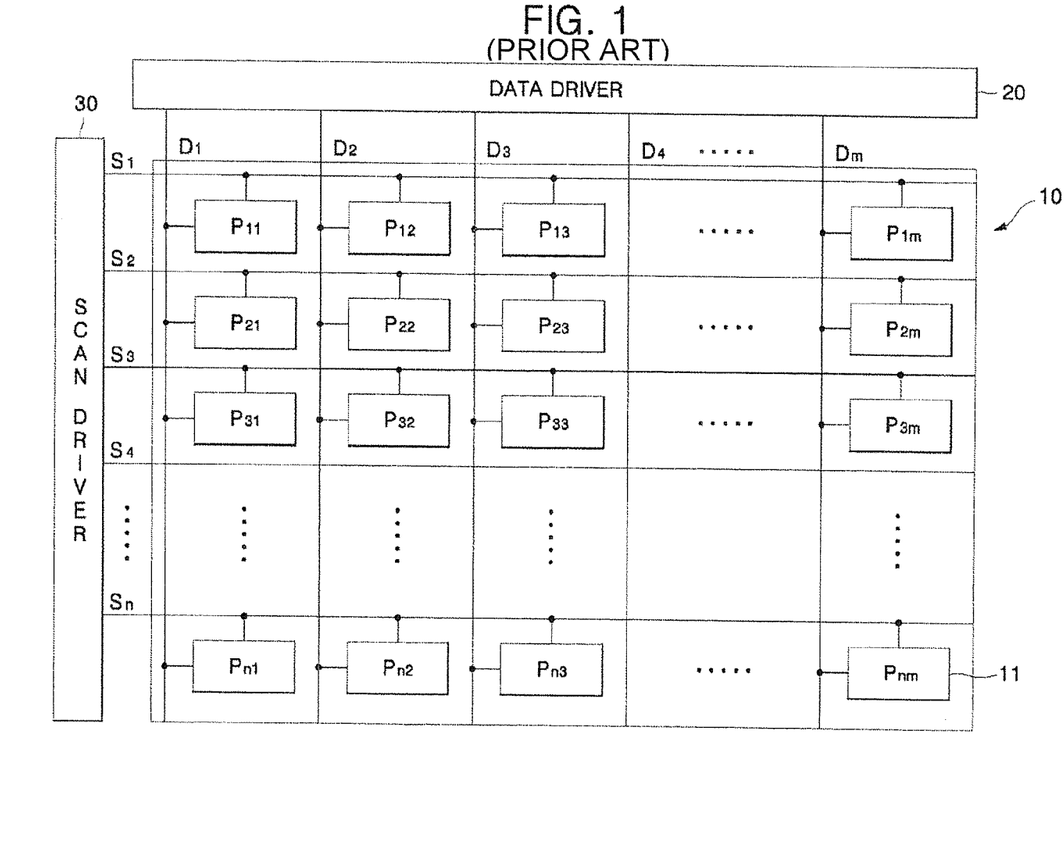
FIG. 1 is a block diagram of a conventional organic EL display device.

FIG. 1 is a block diagram of a conventional organic EL display device.

Referring to FIG. 1, the organic EL display device includes a display panel 10, a data driver 20, and a scan driver 30.

The display panel 10 includes a plurality of data lines D1 to Dm for transmitting a data signal(s), a plurality of scan lines S1 to Sn for transmitting a selection signal(s), which are perpendicular to the plurality of data lines D1 to Dm, and a plurality of pixel circuits P11 to Pnm formed at crossing points of the plurality of data lines D1 to Dm and the plurality of scan lines S1 to Sn.

The data driver 20 outputs the data signal representing an image signal through the plurality of data lines D1 to Dm, and the scan driver 30 sequentially outputs the selection signal to the pixel circuit P11 to Pnm through the plurality of scan lines S1 to Sn.

Figure 2:
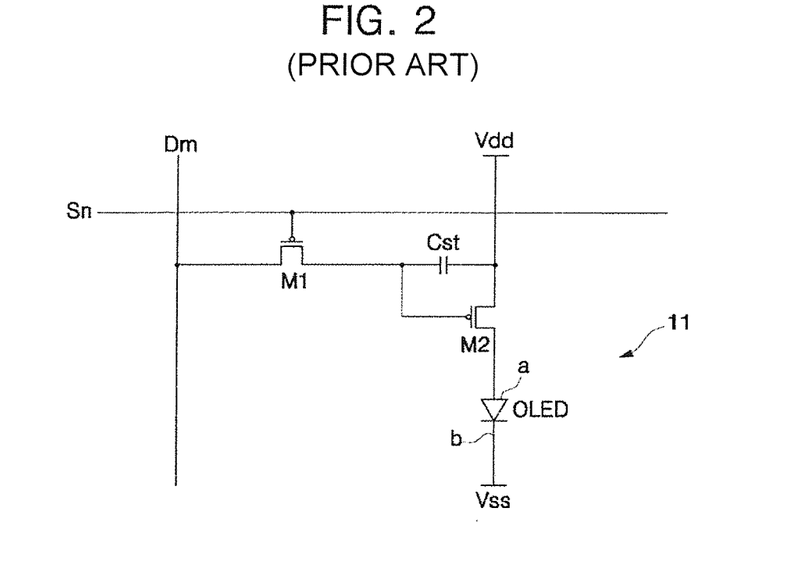
FIG. 2 is a circuit diagram of one pixel of a conventional organic EL display device.

FIG. 2 is a circuit diagram of one pixel of a conventional organic EL display device, i.e., one representative pixel among N×M pixel circuits in the display panel 10 of the organic EL display device of FIG. 1.

As shown in FIG. 2, the pixel circuit 11 includes an organic light emitting diode OLED, a switching transistor M1, a driving transistor M2, and a capacitor Cst.

The switching transistor M1 has a gate connected to the scan line Sn and a source connected to the data line Dm, and transmits the data signal from the data line Dm to a gate of the driving transistor M2 in response to the selection signal from the scan line Sn.

The driving transistor M2 has a source connected to a power voltage Vdd, and the gate connected to a drain of the switching transistor M1, and the capacitor Cst is connected between the gate of the driving transistor M2 and the power voltage Vdd. The capacitor Cst maintains a gate-source voltage $V_{GS}$ of the driving transistor M2 for a predetermined time period.

The organic light emitting diode OLED has an anode a connected to a drain of the driving transistor M2 and a cathode b connected to a reference voltage Vss and emits light corresponding to a driving current applied through the driving transistor M2. Here, the reference voltage Vss connected to the cathode b of the organic light emitting diode OLED is lower than the power voltage Vdd and may be, for example, the ground voltage.

Here, the driving current which flows through the organic light emitting diode OLED is given by the following Equation 1:

$$I_{OLED} = \frac{\beta}{2}(Vgs - Vth)^2 = \frac{\beta}{2}(VDD - Vdata - |Vth|)^2 \qquad \text{Equation 1}$$

where $I_{OLED}$ is the driving current which flows through the organic light emitting diode OLED, Vgs is a voltage between the gate and the source of the driving transistor M2, Vth is a threshold voltage of the driving transistor M2, Vdata is a data voltage, and β is a constant.

As can be seen in Equation 1, the driving current corresponding to the data voltage Vdata applied by the pixel circuit 11 of FIG. 2 is supplied to the organic light emitting diode OLED, and the organic light emitting diode OLED emits light in response to the supplied current.

Figure 3:
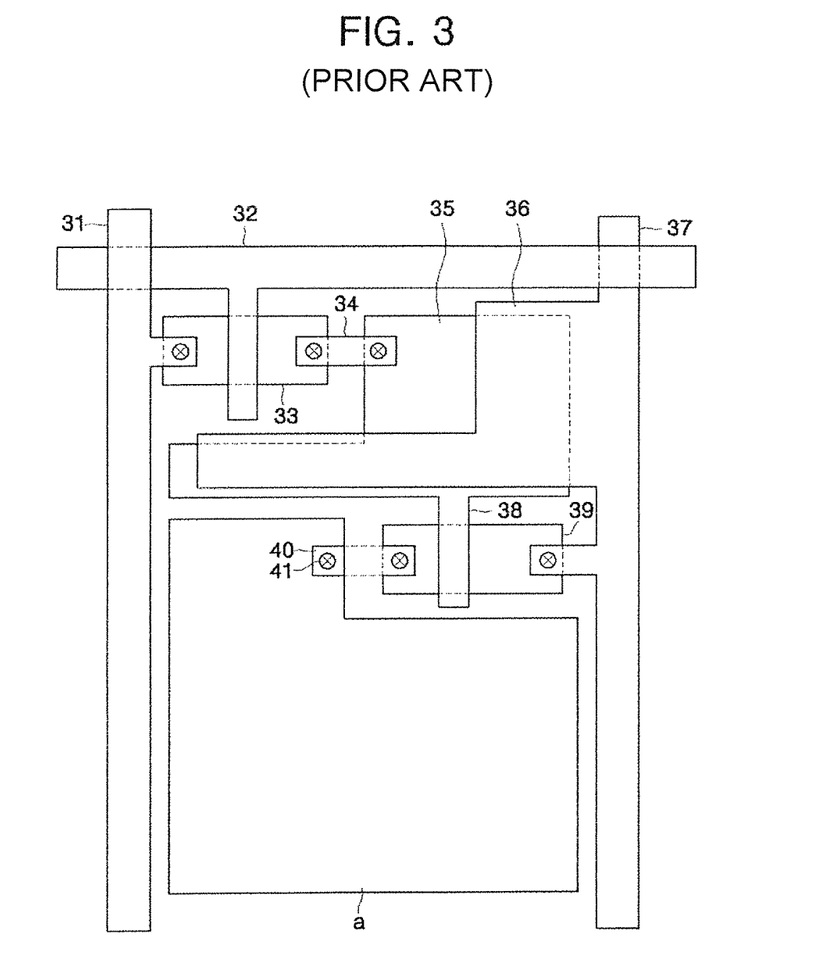
FIG. 3 is a plan view of one pixel of a conventional organic EL display device.

FIG. 3 is a plan view of one pixel of a conventional organic EL display device.

Referring to FIG. 3, the pixel includes a scan line 32 arranged in one direction, a data line 31 arranged perpendicular to the scan line 32, and a power voltage line 37 arranged perpendicular to the scan line 32 and parallel to the data line 31. A switching transistor 33 is connected to the data line 31 and the scan line 32. A capacitor includes a lower capacitor electrode 35 connected to a source or drain electrode 34 of the switching transistor 33 through a contact hole, and an upper capacitor electrode 36 arranged above the lower capacitor electrode 35 to be connected to the power voltage line 37. A gate 38 of a driving transistor 39 is connected to the lower capacitor electrode 35, and an anode a is connected to a source or drain electrode 40 through a via hole 41.

In a unit pixel of the conventional organic light emitting diode described above, an anode a is formed on a substrate, an organic emission layer is formed on the anode a, and a cathode b is formed on the organic emission layer.

Only the organic emission layer (see EL in FIG. 4) is formed between the anode a and the cathode b, and an insulating layer is formed around the anode a, thereby preventing the anode a and the cathode b from being electrically connected directly without the emission layer.

Figure 4:
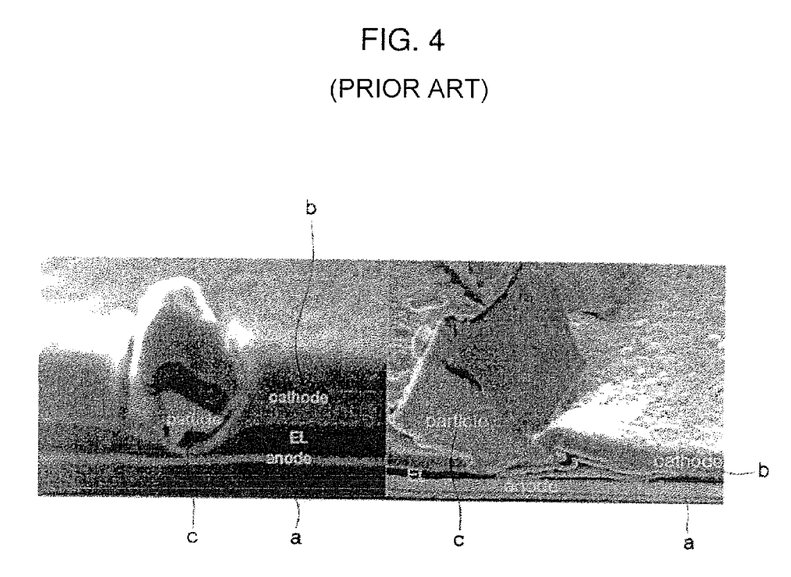
FIG. 4 is a photograph showing a short circuit between an anode and a cathode of a conventional organic EL display device.

However, the conventional organic light emitting diode has one anode and a common cathode per unit pixel; and a relationship between the anode and the cathode may be affected by fine particles inserted between the anode and the cathode during a manufacturing process, a pattern failure of a lower layer, and/or an external pressure. For the foregoing reasons, the anode and the cathode, which should be electrically insulated from each other, may be electrically connected as shown in FIG. 4. FIG. 4 is a photograph illustrating a short circuit formed between the anode and the cathode in the conventional organic EL display device. In FIG. 4, "a" denotes the anode, "b" denotes the cathode, and "c" denotes the fine particles.

As shown in FIG. 4, the fine particles c exist in the insulating layer between the anode a and the cathode b, thereby causing an electrical short circuit between the anode a and the cathode b. The short circuit between the anode a and the cathode b leads to an application of a cathode voltage Vss to the anode a. As a result, a driving current (e.g., $I_{OLED}$) of a driving transistor (e.g., M2) according to a data signal flows not to the organic emission layer but to the cathode b, so that light of a predetermined color is not emitted, thereby causing a dark pixel, i.e., a pixel defect. As organic EL display devices become more compact, more dark pixels resulting from short circuits between the anode and the cathode may occur. Therefore, it is desirable to resolve the foregoing problems.

SUMMARY

An embodiment of the present invention provides an organic EL display device, which includes at least two driving transistors and an organic light emitting diode having at least two first electrodes and a common second electrode per pixel. Accordingly, even if a short circuit occurs between one of the first electrodes and the common second electrode, the organic light emitting diode still emits light using the other first electrode, thereby eliminating effects of the short circuit.

In an exemplary embodiment of the present invention, an organic EL display device includes an organic electroluminescent (EL) display device having a plurality of pixel circuits formed at crossing points of a plurality of scan lines and a plurality of data lines, each of the pixel circuits including: at least two driving transistors connected to a first power voltage line, the at least two driving transistors receiving a data signal through at least one of the data lines and outputting a driving current corresponding to the data signal; and an organic light emitting diode having at least two first electrodes respectively connected to the at least two driving transistors and emitting a light corresponding to the driving current.

In another exemplary embodiment of the present invention, an organic EL display device includes an organic electroluminescent (EL) display device having a plurality of pixel circuits formed at crossing points of a plurality of scan lines and a plurality of data lines, each of the pixel circuits including: a switching transistor having a gate connected to at least one of the scan lines and a source connected to at least one of the data lines, the switching transistor transmitting a data signal from the at least one of the data lines; a capacitor having a first capacitor electrode connected to a drain of the switching transistor and a second capacitor electrode connected to a positive power voltage line, the capacitor storing the data signal during one frame; at least two driving transistors having sources commonly connected to the positive power voltage line and gates commonly connected to the drain of the switching transistor, the at least two driving transistors outputting a driving current corresponding to the data signal; and an organic light emitting diode having at least two first electrodes respectively connected to drains of the at least two driving transistors and emitting a light corresponding to the driving current.

In yet another exemplary embodiment of the present invention, an organic EL display device includes a plurality of pixel circuits formed at crossing points of a plurality of scan lines and a plurality of data lines, each pixel circuit including: a switching transistor having a gate connected to at least one of the scan lines and a source connected to at least one of the data lines, the switching transistor transmitting a data signal from the at least one of the data lines; a capacitor having a first capacitor electrode connected to a drain of the switching transistor and a second capacitor electrode connected to a negative power voltage line, the capacitor storing the data signal during one frame; at least two driving transistors having sources commonly connected to the negative power voltage line and gates commonly connected to the drain of the switching transistor, the at least two driving transistors outputting a driving current corresponding to the data signal; and an organic light emitting diode having at least two first electrodes respectively connected to drains of the at least two driving transistors and emitting a light corresponding to the driving current.

In still another exemplary embodiment of the present invention, an organic EL display device includes: at least two thin film transistors having respective semiconductor layers, gate electrodes, source electrodes, and drain electrodes arranged on a substrate; at least two first electrodes respectively connected to the source electrodes or the drain electrodes of the at least two thin film transistors; an organic emission layer formed on the at least two first electrodes; and a second electrode formed on the entire surface of the organic emission layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

The present invention will now be described with reference to the accompanying drawings, in which exemplary embodiments of the invention are shown.

Figure 5:
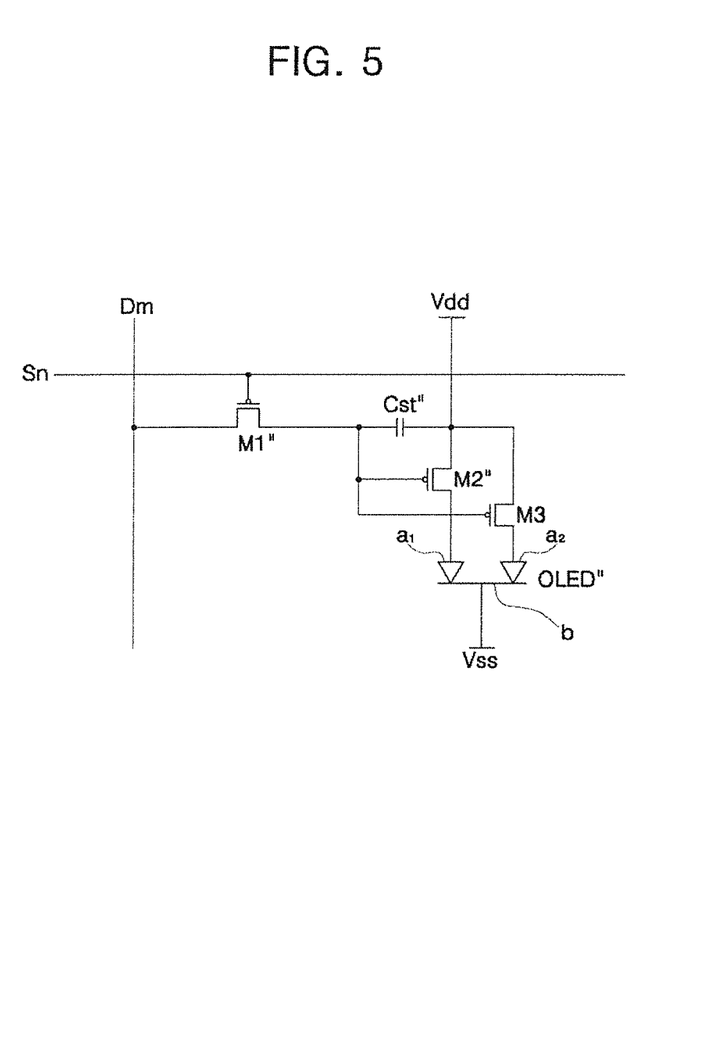
FIG. 5 is a circuit diagram of one pixel according to an embodiment of the present invention.

FIG. 5 is a circuit diagram of one pixel according to an embodiment of the present invention, i.e., one representative pixel among N×M pixels, which is connected to a data line Dm and a scan line Sn.

Referring to FIG. 5, the pixel circuit includes a switching transistor M1", a first driving transistor M2", a second driving transistor M3, a capacitor Cst", and an organic light emitting diode OLED" having first and second anodes a1 and a2. The first and second driving transistors M2" and M3 are each comprised of a PMOS transistor.

The switching transistor M1" has a gate connected to the scan line Sn and transmits a data voltage from the data line Dm connected to its source to gates of the first and second driving transistors M2" and M3 in response to a selection signal from the scan line Sn.

The first driving transistor M2" has a source connected to a positive (or first) power voltage line of a power voltage Vdd, the gate connected to the drain of the switching transistor M1, and a drain connected to the first anode a1 of the organic light emitting diode OLED".

The second driving transistor M3 has a source connected to a positive (or first) power voltage line of the power voltage Vdd, the gate connected to the drain of the switching transistor M1, and a drain connected to the second anode a2 of the organic light emitting diode OLED".

In FIG. 5, the gates of the first and second driving transistors M2" and M3 are commonly connected, and the sources of the first and secondary driving transistors M2" and M3 are commonly connected.

The capacitor Cst is connected between the gates and sources of the first and second driving transistors M2" and M3 to maintain a gate-source voltage $V_{GS}$ during one frame.

The organic light emitting diode OLED" includes a cathode b which is commonly connected to a negative (or second) power voltage line of a reference voltage Vss, and an anode comprised of the first and second anodes a1 and a2. The first anode a1 is connected to the drain of the first driving transistor M2" and the second anode a2 is connected to the drain of the second driving transistor M3. Thus, the organic light emitting diode OLED" emits light corresponding to driving currents supplied from the first and second driving transistors M2" and M3.

An operation of the pixel circuit of FIG. 5 is explained below. When the switching transistor M1" is turned on in response to a selection signal applied to the gate of the switching transistor M1 through the scan line Sn, a data signal transmitted through the data line Dm is transmitted to a first (or lower) electrode of the capacitor Cst", so that a voltage corresponding to a difference between the positive power voltage Vdd and the data signal is stored. Thereafter, the voltage stored in the capacitor Cst is transmitted to the first and second driving transistors M2" and M3. The first and second driving transistors M2" and M3 transmit a driving current corresponding to Equation 1 to the organic light emitting diode OLED" through the first and second anodes a1 and a2, in response to the data signal, so that the organic light emitting diode OLED" emits light.

As described above, if a short circuit between one of the first and second anodes a1 and a2, e.g., the second anode a2 and the cathode b occurs due to an external pressure and/or fine particles leading to a pixel defect, the driving current flowing through the second driving transistor M3 connected to the second anode a2 flows to the cathode b, so that the organic light emitting diode OLED" corresponding to the second anode a2 does not emit light.

However, the organic light emitting diode OLED" corresponding to the first anode a1 connected to the first driving transistor M2" receives the driving current normally to emit light.

In such an instance, the brightness of the pixel is reduced as compared to a state before the short circuit between the second anode a2 and the cathode b occurs, but a dark pixel is not generated, and thus the pixel defect is not noticeable.

In FIG. 5, the first and second driving transistors M2" and M3 are each comprised of a PMOS transistor, but in alternative embodiments the first and second driving transistors may be each comprised of an NMOS transistor.

Figure 6:
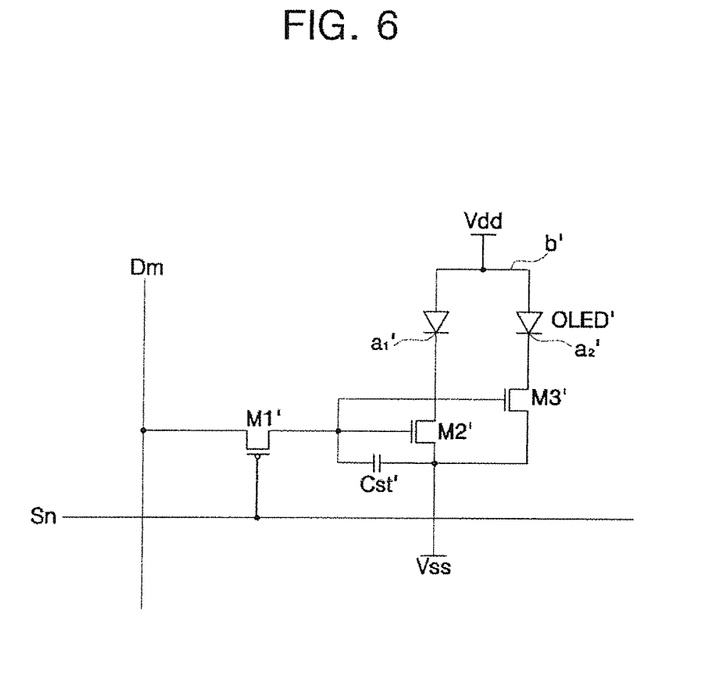
FIG. 6 is a circuit diagram of one pixel having an NMOS-type driving transistor according to another embodiment of the present invention.

FIG. 6 is a circuit diagram of one pixel according to another embodiment of the present invention in which a driving transistor is comprised of an NMOS transistor.

As shown in FIG. 6, the pixel circuit includes a switching transistor M1', a first driving transistor M2', a second driving transistor M3', a capacitor Cst', and an organic light emitting diode OLED' having first and second cathodes a1' and a2'. The first and second driving transistors M2' and M3' are each comprised of an NMOS transistor.

The switching transistor M1' has a gate connected to the scan line Sn and transmits a data voltage from a data line Dm connected to its source to gates of the first and second driving transistors M2' and M3' in response to a selection signal from a scan line Sn.

The first driving transistor M2' has a source connected to a negative (or first) power voltage line of a reference voltage Vss, the gate connected to a drain of the switching transistor M1', and a drain connected to the first cathode a1' of the organic light emitting diode OLED'.

The second driving transistor M3' has a source connected to a negative (or first) power voltage line of the reference voltage Vss, the gate connected to the drain of the switching transistor M1', and a drain connected to the second cathode a2' of the organic light emitting diode OLED'.

In FIG. 6, the gates of the first and second driving transistors M2' and M3' are commonly connected, and the sources of the first and second driving transistors M2' and M3' are commonly connected.

The capacitor Cst' is connected between the gates of the first and second driving transistors M2' and M3' and the sources of the first and second driving transistors M2' and M3' to maintain a gate-source voltage $V_{GS}$ during one frame.

The organic light emitting diode OLED' includes an anode b' which is commonly connected to a positive (or second) power voltage line of a power voltage Vdd, and a cathode comprised of the first and second cathodes a1' and a2'. The first cathode a1' is connected to the drain of the first driving transistor M2' and the second cathode a2' is connected to the drain of the second driving transistor M3'

Those skilled in the art will understand an operation of the pixel circuit of FIG. 6 with reference to the above description on the operation of the pixel circuit of FIG. 5, and thus a detailed description of the operation of the pixel circuit of FIG. 6 is omitted. A structure of the pixel circuit comprised of a PMOS type driving transistor will be explained below.

Figure 7:
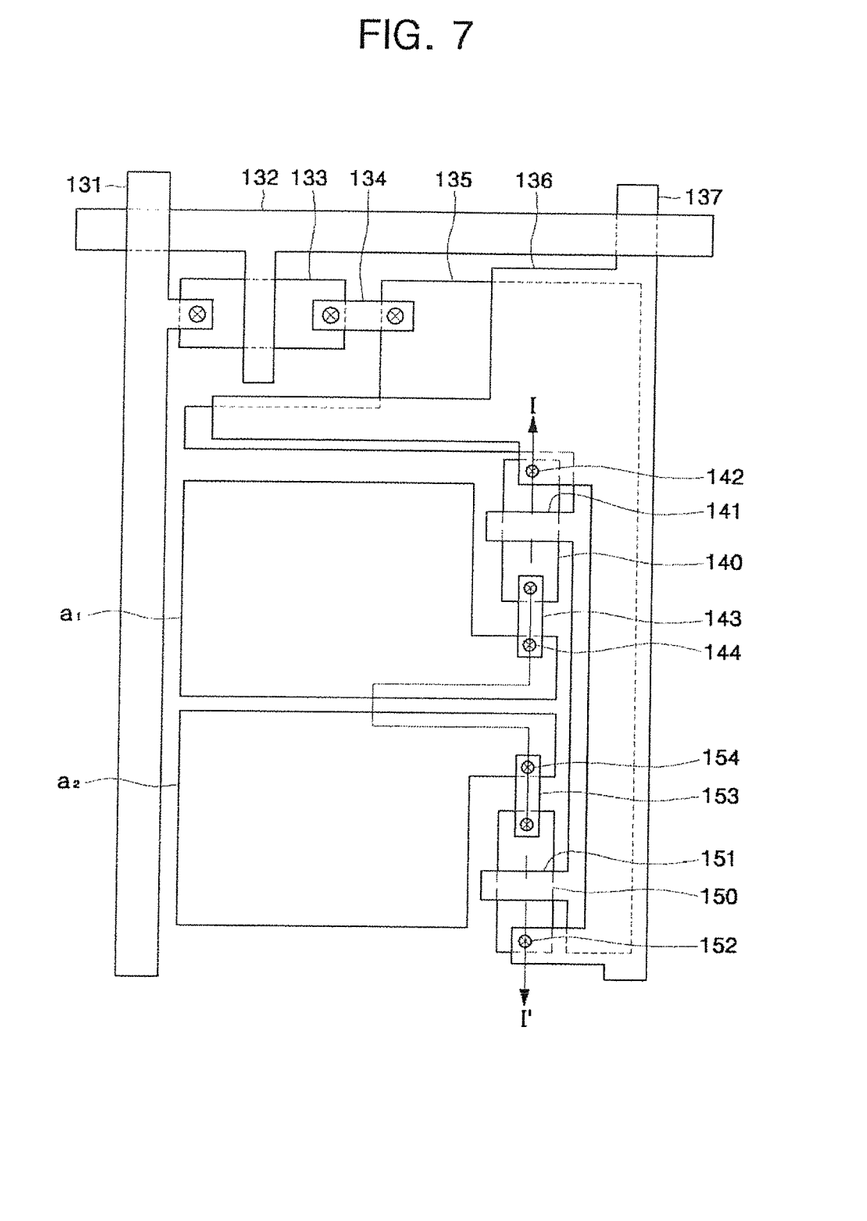
FIG. 7 is a plan view of one pixel of an organic EL display device according to an embodiment of the present invention.

FIG. 7 is a plan view of one pixel of an organic EL display device according to an embodiment of the present invention.

Referring to FIG. 7, the pixel includes a scan line 132 arranged in one direction, a data line 131 arranged perpendicular to the scan line 132, and a positive power voltage line 137 arranged perpendicular to the scan line 132 and parallel to the data line 131.

A switching transistor 133 is connected to the scan line 132 and the data line 131. A capacitor includes a lower capacitor electrode 135 connected to a source or drain electrode 134 of the switching transistor 133 through a contact hole, and an upper capacitor electrode 136 arranged above the lower capacitor electrode 135 to be connected to the positive power voltage line 137.

A first driving transistor 140 has a gate 141 connected to the lower capacitor electrode 135 and a source 142 connected to the positive power voltage line 137. A second driving transistor 150 has a gate 151 connected to the lower capacitor electrode 135 and a source 152 connected to the positive power voltage line 137.

An organic light emitting diode OLED" includes an anode a comprised of first and second anodes a1 and a2, an organic emission layer formed on the first and second anodes a1 and a2, and a common cathode formed on the organic emission layer. Here, the first anode a1 is connected to a source or drain electrode 143 of the first driving transistor 140 through a via hole 144, and the second anode a2 is connected to a source or drain electrode 153 of the second driving transistor 150 through a via hole 154. In one embodiment, the first and second anodes a1 and a2 are formed to have the same area.

In FIG. 7, if a short circuit occurs between the second anode a2 and the cathode b due to an external pressure and/or fine particles, the driving current does not flow to the organic emission layer from the second driving transistor 150 but flows into the cathode b, thereby light is not emitted. But, since the driving current from the first driving transistor 140 flows to the organic emission layer through the first anode a1, light is emitted. An area corresponding to the second anode a2 does not emit light, but an area corresponding to the first anode a1 emits light, and thus while the brightness of the pixel is reduced, a dark pixel does not occur, and the pixel defect is unnoticeable.

Figure 8:
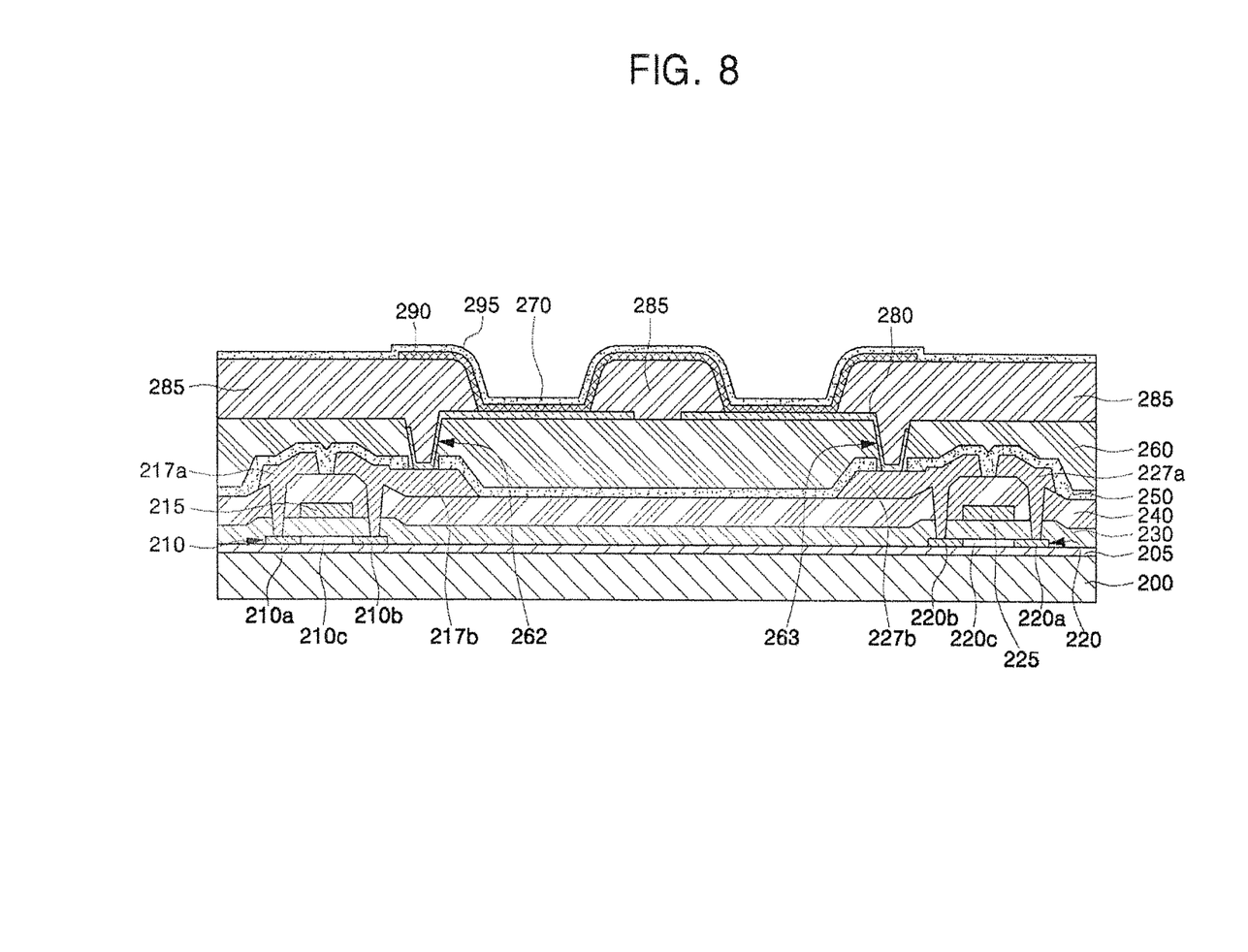
FIG. 8 is a cross-sectional view taken along line I-I' of FIG. 7.

FIG. 8 is a cross-sectional view taken along line I-I' of FIG. 7.

Referring to FIG. 8, a buffer layer 205 is arranged on a substrate 200, and first and second semiconductor layers 210 and 220 are formed on the buffer layer 205. The buffer layer 205 is optional, but is included in one embodiment because it prevents impurities from invading the device from the substrate 200. The buffer layer 205 may be formed of silicon nitride ($SiN_x$), silicon oxide $SiO_2$, and/or silicon oxynitride ($SiO_xN_y$). The first semiconductor layer 210 is formed of an amorphous silicon layer and/or a crystalline silicon layer and includes source and drain regions 210a and 210b and a channel region 210c. The second semiconductor layer 220 is formed of an amorphous silicon layer and/or a crystalline silicon layer and includes source and drain regions 220a and 220b and a channel region 220c. A gate insulating layer 230 and gate electrodes 215 and 225 are formed above the substrate having the first and second semiconductor layers 210 and 220, and an interlayer insulator 240 is formed over the substrate 200 having the gate electrodes 215 and 225, and source and drain electrodes 217a and 217b and 227a and 227b are formed to be connected to the source and drain regions 210a and 210b and 220a and 220b of the first and second semiconductor layers 210 and 220, respectively.

A passivation layer 250 is formed above the substrate 200 having the source and drain electrodes 217a and 217b and 227a and 227b to protect the lower layers from moisture and impurities and/or during an etching process. The passivation layer 250 is formed of $SiO_2$, $SiN_x$, and/or a stacked layer of $SiO_2/SiN_x$.

A planarization layer 260 may be formed on the passivation layer 250. First and second anodes 270 and 280 are formed on the planarization layer 260. The first and second anodes 270 and 280 are made of a transparent material such as indium tin oxide (ITO) and/or indium zinc oxide (IZO); and/or a compound or stacked layer including a reflective layer made of a material having high reflectivity, such as aluminum (Al), an aluminum alloy, silver (Ag), and/or a silver alloy, and a transparent material layer made of indium tin oxide (ITO) and/or indium zinc oxide (IZO).

The first anode 270 is electrically connected to one of the source and drain electrodes 217a and 217b, e.g., the drain electrode 217b, through a via hole 262 formed in the planarization layer 260 and the passivation layer 250, and the second anode 280 is electrically connected to one of the source and drain electrodes 227a and 227b, e.g., the drain electrode 227b, through a via hole 263 formed in the planarization layer 260 and the passivation layer 250.

A pixel defining layer 285 is formed above the substrate having the first and second anodes 270 and 280. The pixel defining layer 285 is etched to have two opening portions which expose the first and second anodes 270 and 280, respectively.

An organic emission layer 290 is formed on the first and second anodes 270 and 280, and a common cathode 295 is formed over the entire surface of the substrate to cover the organic emission layer 290.

As described above, in an organic EL display device of the present invention, even if a short circuit occurs between one of at least two anodes and a cathode, and a portion of an organic light emitting diode corresponding to the short circuit anode does not emit light, the other portion(s) of the organic light emitting diode corresponding to the rest of the anodes emits light normally, and a pixel defect due to the short circuit is unnoticeable.

In FIGS. 5 to 8, the pixel circuit includes the two driving transistors and the organic light emitting diode which is comprised of the two anodes and the common cathode, but the pixel circuit can be configured to have more than two, i.e., n driving transistors, and/or the organic light emitting diode can be configured to have n anodes and a common cathode. That is, according to the present invention, the number of driving transistors and anodes per pixel is at least two.

As described above, according to the present invention, in an organic EL display device having at least two driving transistors and an organic light emitting diode having at least two first electrodes and a common second electrode per pixel, even if a short circuit occurs between one of the first electrodes and the second electrode, since the organic light emitting diode corresponding to the other first electrode(s) emits light, the resulting pixel darkening effect is unnoticeable.

Although the present invention has been described with reference to certain exemplary embodiments thereof, it will be understood by those skilled in the art that a variety of modifications and variations may be made to the present invention without departing from the spirit or scope of the present invention defined in the appended claims and their equivalents.

What is claimed is:

1. An organic electroluminescent (EL) display device comprising:
   at least two thin film transistors comprising respective semiconductor layers, gate electrodes, source electrodes, and drain electrodes all arranged on a substrate, the gate electrodes being connected together;
   at least two first electrodes respectively connected to the source electrodes or the drain electrodes of the at least two thin film transistors;
   an organic emission layer on the at least two first electrodes;

a pixel defining layer having at least two opening portions for respectively exposing the at least two first electrodes to the organic emission layer; and a second electrode on an entire surface of the organic emission layer facing oppositely away from the at least two first electrodes, wherein the organic emission layer has at least two separate light emitting areas that are configured to emit the light in substantially the same direction and that have substantially the same size, wherein the at least two first electrodes are adjacent in a first direction, and separated in the first direction, and each of the at least two first electrodes corresponds to a corresponding one of the at least two separate light emitting areas, and wherein the at least two opening portions are adjacent in the first direction.

2. The organic EL display device of claim 1, wherein the at least two first electrodes are transparent conductive layers made of indium tin oxide (ITO) and/or indium zinc oxide (IZO).

3. The organic EL display device of claim 1, wherein the at least two first electrodes are formed by a stacked layer comprising:

a reflecting layer made of a material selected from a group consisting of aluminum (Al), an aluminum alloy, silver (Ag), a silver alloy and combinations thereof; and a transparent conductive layer made of indium tin oxide (ITO) and/or indium zinc oxide (IZO).

4. The organic EL display device of claim 1, wherein the at least two thin film transistors have a same conductivity polarity.

5. The organic EL display device of claim 1, further comprising a passivation layer between the at least two thin film transistors and the second electrode.

6. The device of claim 5, wherein the passivation layer has at least two via holes, and wherein the source electrodes or the drain electrodes of the at least two thin film transistors are respectively connected to the at least two first electrodes through the two via holes, respectively.

7. The device of claim 5, further comprising a planarization layer on the passivation layer.

8. The device of claim 7, wherein the passivation layer and the planarization layer have at least two via holes, and wherein the source electrodes or the drain electrodes of the at least two thin film transistors are respectively connected to the at least two first electrodes through the two via holes, respectively.

9. The device of claim 1, further comprising a pixel defining layer having at least two opening portions for respectively exposing the at least two first electrodes to the organic emission layer.

* * * * *